United States Patent [19]

Cheng

[11] Patent Number: 5,452,078
[45] Date of Patent: Sep. 19, 1995

[54] METHOD AND APPARATUS FOR FINDING WAFER INDEX MARKS AND CENTERS

[75] Inventor: David Cheng, Sunnyvale, Calif.

[73] Assignee: Ann F. Koo, Los Altos, Calif.

[21] Appl. No.: 78,416

[22] Filed: Jun. 17, 1993

[51] Int. Cl.6 .................. G01N 21/86; G01B 11/00
[52] U.S. Cl. .................. 356/150; 356/400; 250/548; 250/559.29
[58] Field of Search ........... 356/150, 400; 414/936, 414/937, 938; 250/537, 548, 561

[56] References Cited

U.S. PATENT DOCUMENTS

| | | | |
|---|---|---|---|
| 4,457,664 | 7/1984 | Jodell et al. | 414/779 |
| 4,819,167 | 4/1989 | Cheng et al. | 364/167.01 |
| 4,853,880 | 8/1989 | Akamatsu et al. | 364/559 |
| 4,907,035 | 3/1990 | Galburt et al. | 356/150 |
| 5,125,791 | 6/1992 | Volovich | 356/400 |
| 5,159,202 | 10/1992 | Ametani | 356/400 |
| 5,194,743 | 3/1993 | Aoyama et al. | 356/400 |
| 5,238,354 | 8/1993 | Volovich | 356/400 |
| 5,264,918 | 11/1993 | Kagami | 356/150 |

Primary Examiner—Robert P. Limanek
Assistant Examiner—David B. Hardy
Attorney, Agent, or Firm—Hickman & Beyer

[57] ABSTRACT

A method and apparatus for finding wafer index marks and centers. A wafer having a flat or notch along its edge is placed on a rotatable platform so that a portion of the wafer's edge is positioned within a sensor assembly. The wafer is rotated, and the sensor reads the distance from the center of rotation to the edge of the wafer. This distance is measured at several angles of the wafer and the data is stored in a digital computer as a series of datapoints including an angle and a distance. A computer-implemented process calculates various geometries concerning the wafer including the location of the index mark and the center of the wafer.

20 Claims, 8 Drawing Sheets

METHOD AND APPARATUS FOR FINDING WAFER INDEX MARKS AND CENTERS

BACKGROUND OF THE INVENTION

1. Field of the Invention

This invention relates to semiconductor manufacturing, and more particularly to semiconductor wafer handling apparatus and methods.

2. Background of the Related Art

Semiconductor wafers are handled in many types of test and manufacturing equipment. For wafer test equipment, there is often a need to know the orientation of a wafer so that the location and characteristics of test points may be measured against a standard reference. For this and other reasons, wafers are manufactured with index marks such as flats or notches provided in the edge of the wafer. A testing apparatus can position the wafer at a chosen orientation or test a specific section of the wafer by referencing the index mark. Semiconductor manufacturing equipment can use the index mark to reliably position a wafer within a reaction chamber or test station.

There is also often a need to know the location of the center of a wafer. For example, robot arms that handle wafers are preferably able to detect the center of a wafer so that the arm can reliably position the wafer on a testing platform. It is therefore desirable to have a mechanism for finding both the index mark ("notch" or "flat") and the center of a wafer for both testing and manufacturing purposes.

Wafer flat and center finders in the prior art sometimes use a video camera to visually inspect a wafer to determine the location of the index mark and the center of the wafer. Such inspection systems are expensive and complex, requiring substantial signal processing of the video output of the camera and complicated calculations to determine the location of the index mark and the center of the wafer.

Another prior art device mechanically rotates one or more wafers within a wafer cassette to position the index mark in a known location. Such mechanical apparatus are inherently less accurate than non-mechanical approaches to flat and center finding. Such prior art apparatus also tend to generate particles due to rubbing of the wafer against the cassette, which has a tendency to reduce yields of the devices and circuits produced from the wafers.

What is needed is an apparatus and method that will quickly, accurately and economically find the flat or notch on a wafer as well as find the center of the wafer.

SUMMARY OF INVENTION

The present invention addresses the problems in the prior art by providing a method and apparatus to find wafer index marks and wafer centers by using a turntable and an edge detector assembly. A wafer is placed on the turntable and rotated past the detector assembly, which monitors the position of the edge of the wafer as it rotates past. A notch orientation is calculated using the derivative of a series of radius and angle datapoints of the edge of the wafer measured by the sensor assembly. A flat orientation is found by using a derivative of a series of radius and angle datapoints and calculating a perpendicular line to the flat datapoints. The center of the wafer is calculated from the radius and angle data. These improvements allow the index mark and the center of a wafer to be quickly, accurately, and economically determined.

The apparatus includes a test apparatus for finding the index mark, including notches and flats, in the edge of a wafer, and for finding the center of a wafer. A robot arm removes a wafer from a wafer cassette and places it on a rotatable platform of the test apparatus. The platform rotates the wafer so that the edge of the wafer passes a sensor assembly. The sensor assembly detects the distance from the wafer edge to the center of rotation of the platform and a computer calculates a function corresponding to angle and distance datapoints provided by the sensor assembly. A least squares data fit is used to calculate datapoints obtained at the anomaly caused by an index mark.

The computer calculates the orientation of a notch by taking the first derivative of the angle-radius datapoints. The derivative exaggerates the anomaly generated by the notch, such that the center of the notch can be more accurately calculated. The orientation of a flat is found by calculating a first derivative of the angle-radius datapoints and selecting the points of data that occur in the anomaly generated by the flat. The flat orientation is determined by calculating a perpendicular line to a straight line formed by those points.

Once the position of the flat or notch is known, the center of the wafer is calculated by using angle and distance datapoints from the flat-finding step.

Knowing the index mark and center positions, the controlling computer can rotate the wafer so that the index mark is oriented in a desired direction. The computer can then move the robot arm by an offset distance (i.e. the distance between the center of rotation of the platform and the center of the wafer) and the arm picks up the wafer at the center location of the wafer. The wafer can now be placed in a testing or production apparatus with the index marker oriented correctly and the wafer accurately centered.

The present invention has the advantage of accurately finding and calculating the location of a flat or notch on a wafer. By measuring the distance of the edge of the wafer to the center of rotation at a number of angular positions and taking the derivative of the measured datapoints, the notch or flat location along the wafer edge is determined quickly and accurately. The center of the wafer is also easily determined from the measured datapoints.

The present invention also has the advantage of using inexpensive, simple, and reliable components, thereby reducing the complexity of the apparatus and also reducing production and maintenance costs.

These and other advantages of the present invention will become apparent to those skilled in the art after reading the following descriptions and studying the various figures of the drawings.

BRIEF DESCRIPTION OF THE DRAWINGS

FIG. 6 is a graph of the radius and angle data measured for the wafer of FIG. 5a;

DETAILED DESCRIPTION OF THE PREFERRED EMBODIMENTS

Figure 1:
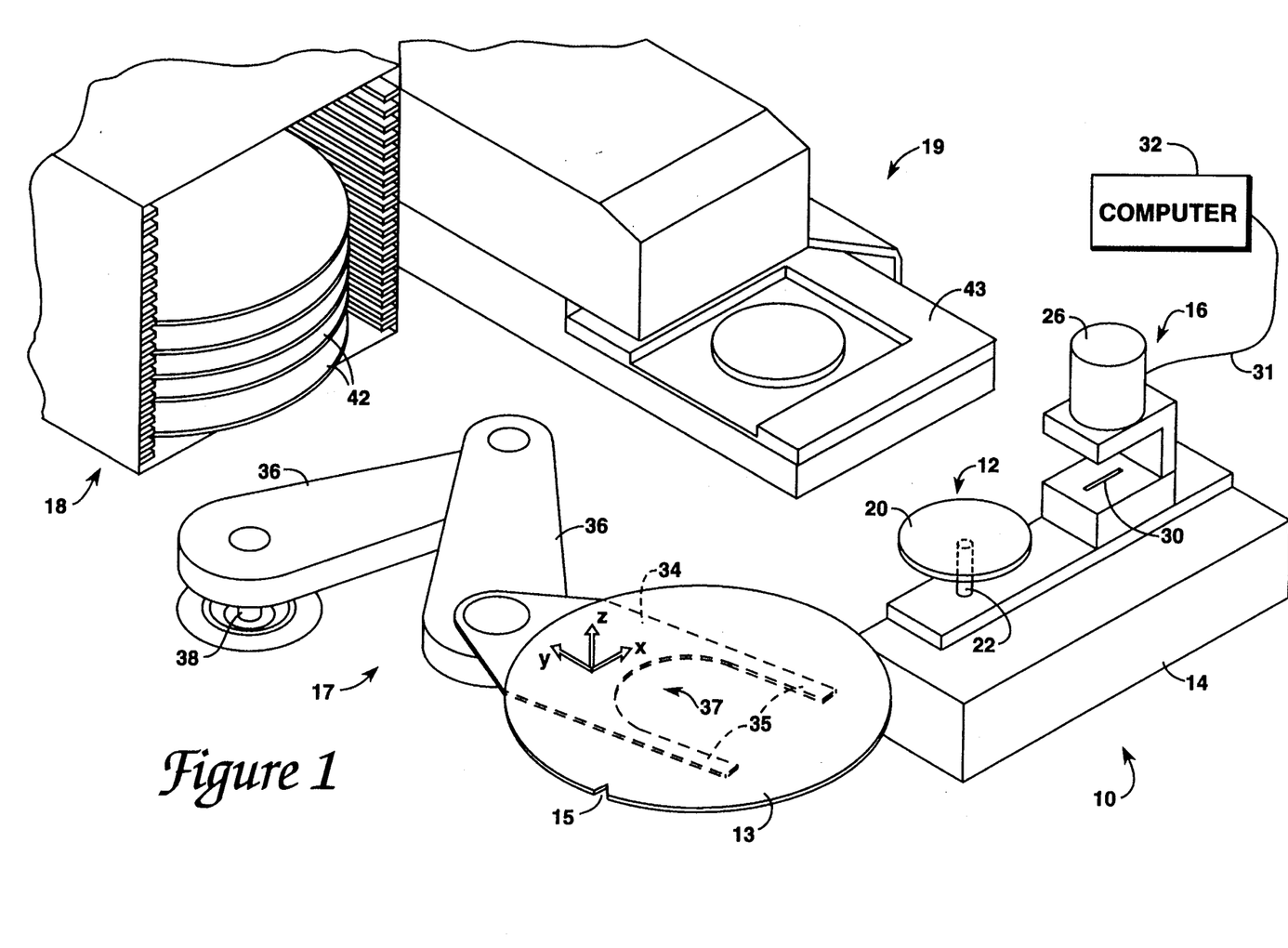
FIG. 1 is a perspective view of a wafer index mark and center finder of the present invention.

FIG. 1 is a perspective view of an apparatus 10 for finding the flat and center of a wafer in accordance with the present invention. Apparatus 10 includes a turntable assembly 12, base 14, and a sensor assembly 16. Also shown are a robot arm 17, a wafer cassette 18, and a testing apparatus 19. The turntable assembly 12 preferably includes a rotatable platform 20 and a support shaft 22 coupled to a motor (not shown here). Turntable assembly 12 is adapted to support a wafer 13 provided with an index mark 15. The index mark is typically a triangular notch or flat(s) provided in the edge of the wafer.

Sensor assembly 16 is mounted on base 14 at a distance of about the radius of a wafer from the center of rotation of the turntable assembly 12. An emitter (not shown) of the sensor is located in a lower section of the sensor assembly 16 and projects a beam of electromagnetic energy, such as visible or infrared light, towards a detector 26 located on an upper section of the assembly 16 (see also FIG. 4). The beam is projected from the emitter, through a slit 30, to the detector 26. The detector is able to sense the beam of light projected through slit 30 that is not blocked by wafer 13, and outputs a signal indicating the amount of unblocked light on bus 31 to a digital computer 32. In this fashion, the sensor assembly 16 detects the index mark 15 on the wafer's edge as it rotates through the sensor.

Robot arm 17 includes a forked spatula 34, a jointed arm 36, and a pivoting support rod 38. The spatula 34 is designed to hold a wafer 13, and includes a pair of prongs 35 defining a semicircular opening 37. The opening 37 permits spatula 34 to partially surround platform 20 and approximately center a wafer 13 on the platform. The spatula 34 can be moved in the horizontal (x-y) plane by jointed arm 36. The spatula 34 can be moved in a vertical (z-axis) direction by moving support rod 38 upwardly and downwardly. The robot arm 17 is controlled by stepper motors (not shown) which are controlled by computer 32. Robotic arms are available commercially from such companies as Gemark, Brooks, or Scientific Measurement Systems.

Wafer cassette 18 is positioned within reach of the robot arm 17 for access to wafers stored therein. Cassette 18 holds a number of wafers 42 that are supported horizontally by grooves or slots in the sides of the cassette. Wafers 42 may be tested for various characteristics, and thus their index mark and center locations should be determined prior to positioning them on testing platforms.

Testing apparatus 19 is an example of a machine that tests wafers for various characteristics. The apparatus 19 can, for example, test for wafer flatness. Testing platform 43 is a test surface that preferably receives a wafer on the center of the platform. The flat or notch in the wafer is preferably at a desired location to create a reliable coordinate system for the wafer.

The mechanics of moving the wafer and finding the wafer flat and center are as follows. The robot arm 17 positions itself horizontally in front of a slot in the wafer cassette 40 and removes a wafer by moving spatula 34 underneath the wafer, lifting the wafer, and moving horizontally to the turntable assembly 12. The robot arm then lowers the spatula 34 so that platform 20 is positioned between prongs 35 of the spatula. The spatula lowers and withdraws, leaving the wafer 13 on the platform.

The positions of the index mark and center of wafer 13 are then found using turntable assembly 12, sensor assembly 16, and computer 32 with the method described below. The wafer may then be rotated so that the flat or notch is positioned in a preferred orientation. The robot arm can pick up the wafer 13 at the calculated center by moving a calculated horizontal offset distance and lifting the wafer.

Alternatively, the robot arm can pick up the wafer 13 in the same position it had placed the wafer on the rotating turntable 20, or any other known position. Since the offset (i.e. the distance between the center of rotation of turntable assembly 12 and the center of wafer 13) is known, the computer 32 can compensate by adjusting the robot arm by the offset distance and direction after the wafer has been picked up and then placing the wafer 13 on a testing platform or similar surface utilizing the known offset.

The robot arm then places the wafer on a testing or production platform, such as platform 43 of testing apparatus 19. Once the testing or production apparatus has completed its task on the wafer, the wafer 13 can be placed back into wafer cassette 19 by the robot arm and an additional wafer can be tested using the same index mark and center finding procedure.

Figure 2:
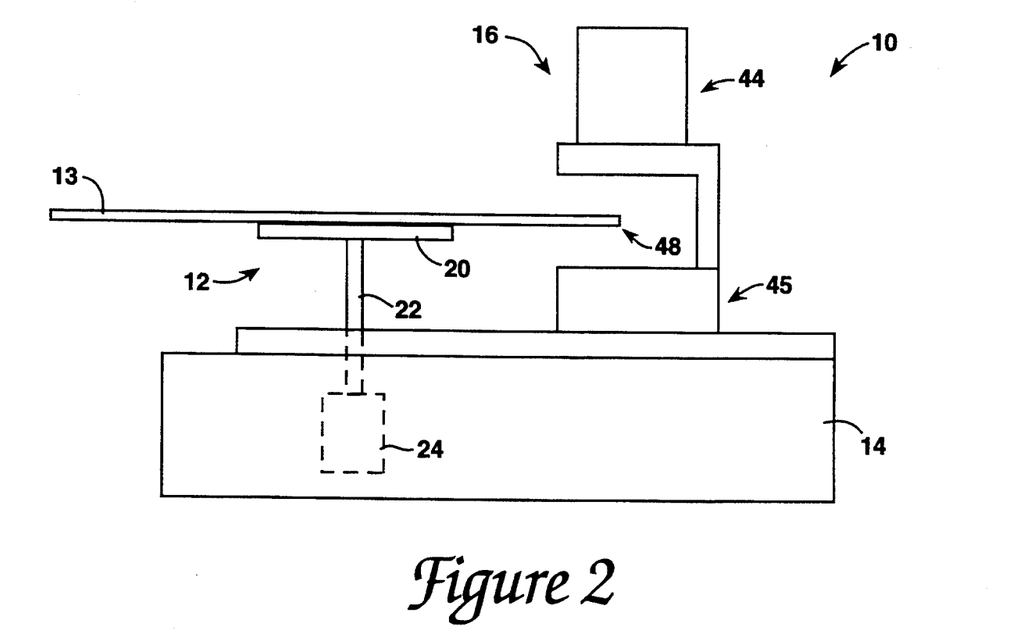
FIG. 2 is a side elevational view of the wafer flat and center finder.

FIG. 2 is a side elevational view of the index mark and center finder, including the turntable assembly 12, the sensor assembly 16, and a wafer 13 positioned on the test turntable. Motor 24 rotates turntable 20 by means of a shaft 22. Motor 24 is preferably a stepper motor coupled to computer 32 by a bus (not shown) including appropriate control lines.

The edge 48 of wafer 13 is shown positioned between upper section 44 and lower section 45 of the sensor assembly 16. In this preferred embodiment, upper section 44 includes a detector, and lower section 45 includes an emitter. In another embodiment, these positions can be reversed. Emitter 54 is preferably a high intensity LED provided by Hewlett-Packard Company. The sensor assembly is detailed below with reference to FIG. 4.

Figure 3:
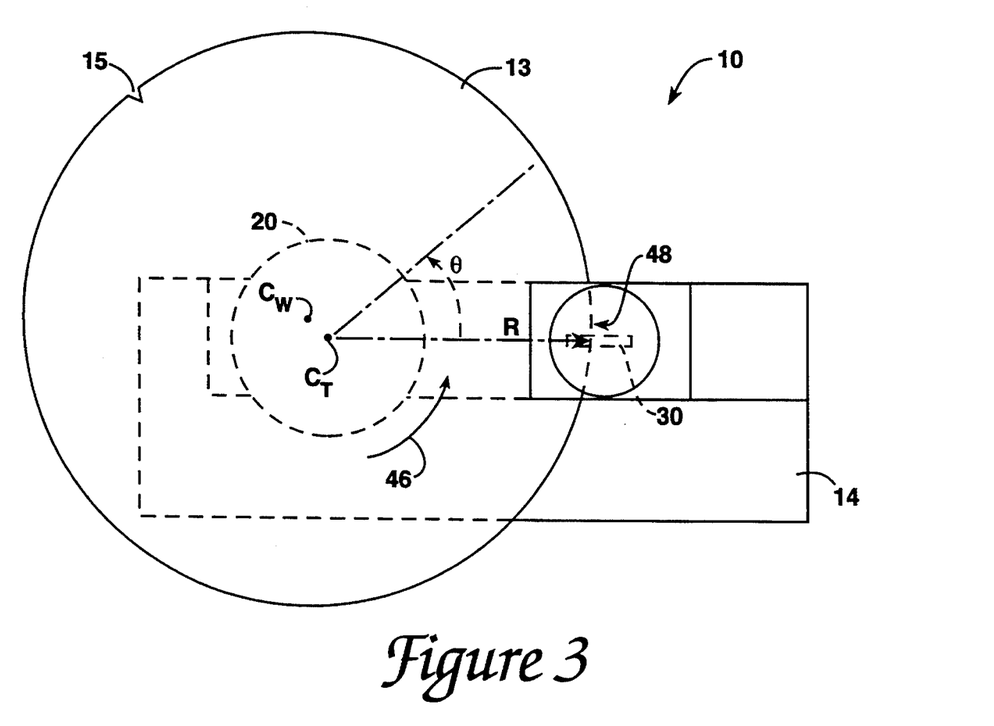
FIG. 3 is a top plan view of the wafer flat and center finder.

FIG. 3 is a top plan view of the flat and center finder shown in FIG. 2. The wafer 13 is positioned on platform 20 so that its edge is between the emitter and detector of sensor assembly 16. Platform 20 is rotated by motor 24 in the direction of arrow 46. Of course, the platform can equally well be rotated in the opposite direction. In the preferred embodiment, the turntable rotates at a rate of about 6 radians per second. The center of rotation of the wafer is the center $C_T$ of the platform. The center $C_W$ is the center of the wafer. Due to inaccuracies in the placement of the wafer 13 on the turntable 20, the center $C_W$ may be offset from $C_T$. As the wafer 13 rotates, the edge 48 passing through the sensor assembly 16 moves slightly in and out of the sensor assembly 16 due to the off-center position of the wafer 13. The radius R is defined as the distance from the center of rotation $C_T$ to the edge 48 of the wafer being sensed by sensor assembly 16. The angle $\theta$ is the angle of rotation of the wafer from the axis coincident with radius R.

Figure 4:
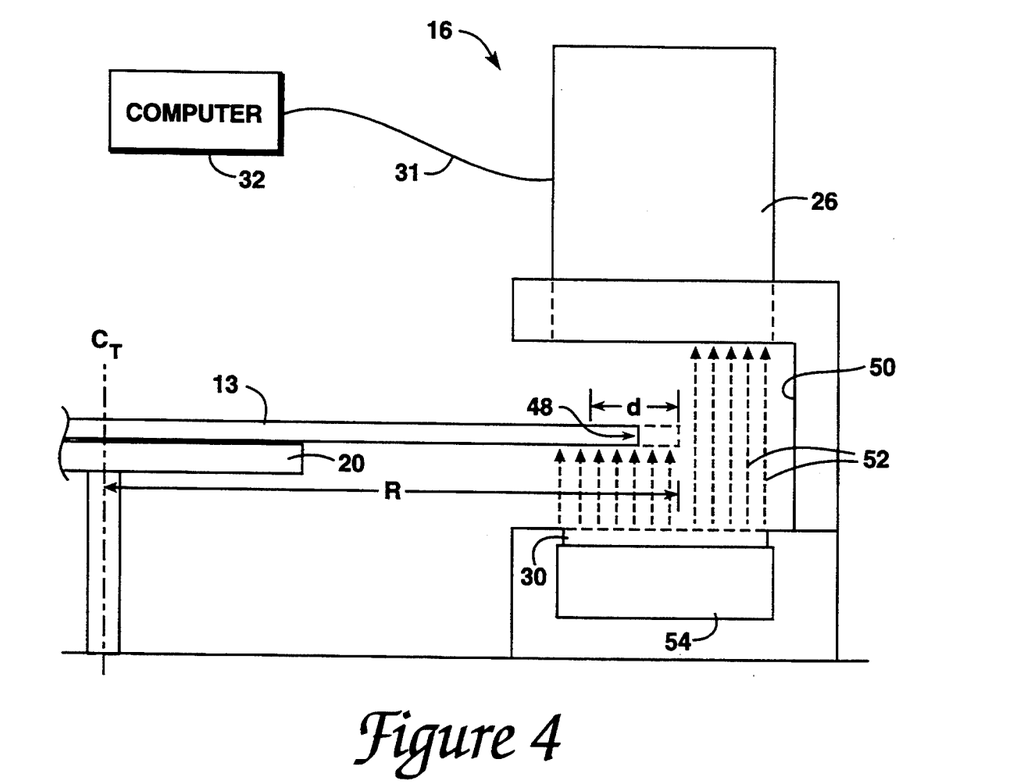
FIG. 4 is a detailed side elevational view of the sensor assembly of the present invention and the edge of a wafer.

FIG. 4 is a detailed view of the inside of the sensor assembly 16 and the edge of the wafer 48. As the wafer 13 rotates, the edge 48 moves closer to and further from a back wall 50 of the sensor assembly due to the offset between the center of the turntable $C_T$ and the center of the wafer $C_W$. The sensor assembly 16 measures the radius R of the wafer which varies by a distance d as the wafer rotates by sending beams 52 of electromagnetic energy from an emitter 54 through slit 30 to detector 26. Distance d is effectively the window of varying distances from the edge of the wafer 48 to the center of rotation $C_T$, and has been greatly exaggerated here for clarity. Detector 26 can be a single photosensor that measures the amount of photons of light received on its surface. Detector 26 is preferably a photodetector with linear output provided by United Detector Technology. The edge 48 of wafer 13 blocks a certain percentage of rays 52 produced by the emitter from reaching detector 26, thereby varying the electrical output of the photosensor in relation to the number of photons impinging upon its surface. Alternatively, a photosensor array can be used with some loss in resolution.

Slit 30 must be made wide enough so that a significant number of photons can travel from the emitter to the detector. However, slit 30 must also be made narrow enough to provide a high resolution so that the computer 32 has enough data points to detect the presence of a small index mark, such as a notch. In the preferred embodiment, the slit 30 is about 0.5 millimeters wide and about 15 millimeters long.

Detector 26 can be calibrated in several ways. The maximum and minimum amounts of light emitted by emitter 54 can be determined by turning the emitter on and off and measuring the amount of light detected in each case. A spiral test piece can be placed on the platform and rotated through the sensor assembly. The radius of the spiral varies linearly along its circumference, so that varying amounts of light received by detector 26 are associated with certain radii of the test piece. The computer 32 can then determine the radius of a wafer by the amount of light received by the detector 26.

The computer 32 preferably samples the output of detector 26 at predetermined angular intervals, each interval being set small enough to map out the edge in detail. Assuming a constant rate of rotation, the detector 26 effectively takes a measurement every o degrees of revolution, where o is calculated by the equation:

$$\phi = \frac{360}{M} \frac{\text{degrees}}{\text{measurement}} \quad (1)$$

where M is the number of measurement points along the edge of the wafer. In the preferred embodiment, the detector reads 4000 points along the edge of the wafer per revolution, and thus takes a measurement every 0.09 degrees of revolution.

Figure 5A:
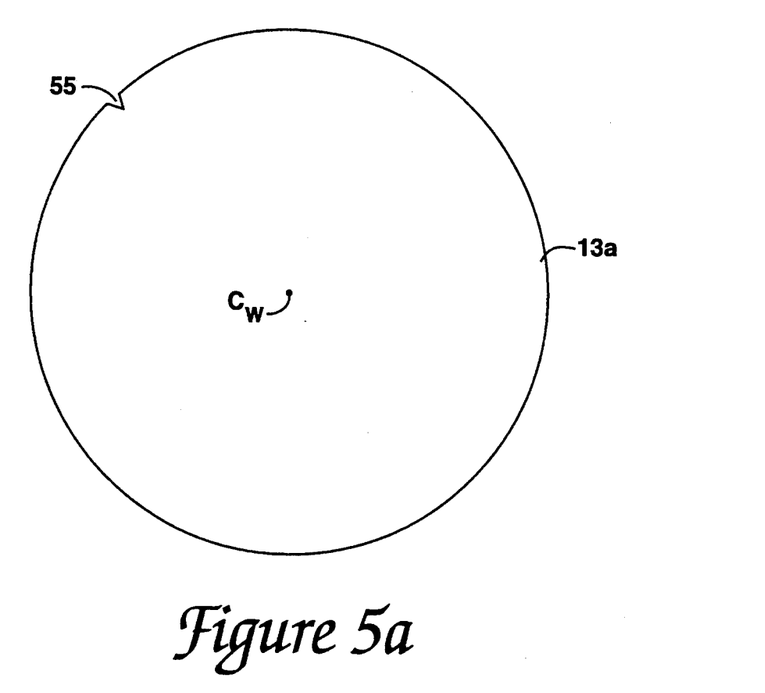
FIG. 5a is a top plan view of a wafer with a notch in its edge.

FIG. 5a is a top plan view of a wafer 13a. Typically, such a wafer is about four to eight inches in diameter and is made from semiconductor grade silicon. The index mark of the wafer shown in FIG. 5a is a notch 55 provided in the edge of the wafer. The center of the wafer $C_W$ is also shown in the figure.

Figure 5B:
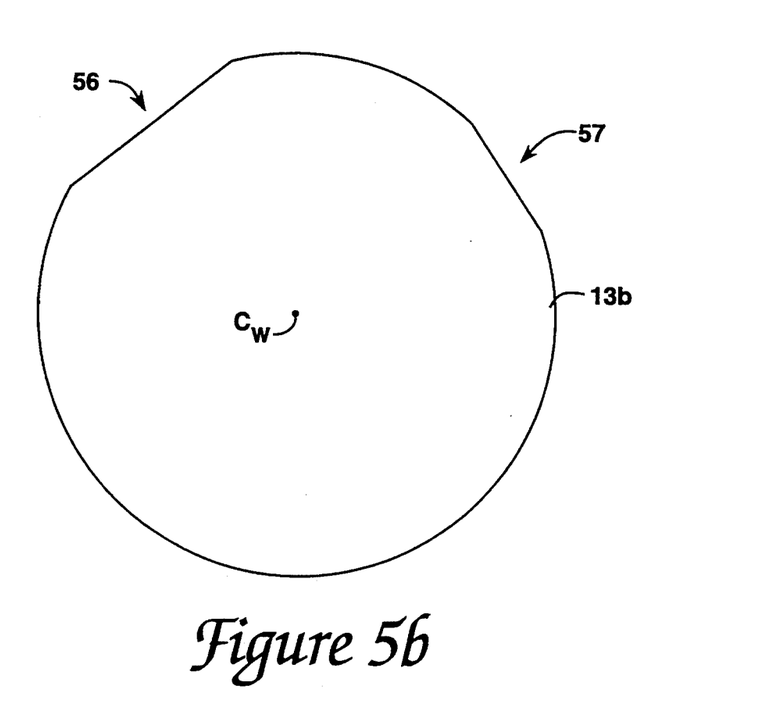
FIG. 5b is a top plan view of a wafer with primary and secondary flats in its edge.

FIG. 5b is a similar top plan view of a wafer 13b, except flats 56 and 57 are provided in the edge of the wafer instead of a notch. The primary flat 56 and secondary flat 57 serve the same purpose as notch 55 of providing a reference for points mapped out on the wafer surface.

Figure 6:
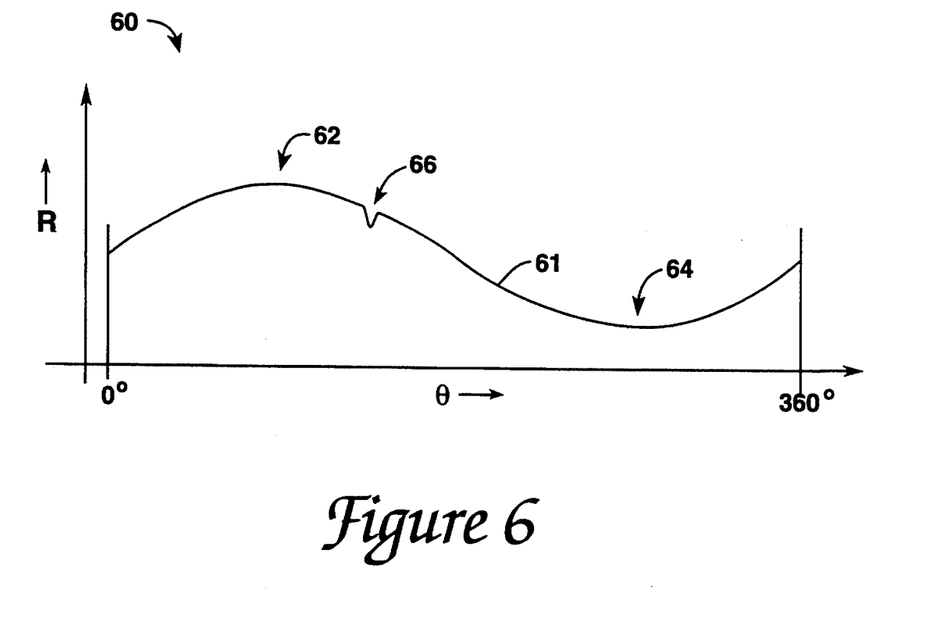

FIG. 6 is a graph 60 of the data measured during the rotation of the wafer shown in FIG. 5a (notched wafer). The horizontal axis represents the angle of rotation $\theta$ from a starting, reference position. The vertical axis represents the radius R, defined as the distance from the center of rotation to the edge 48 of the wafer rotated through the sensor assembly 16.

Line 61 represents the distance from the edge of the wafer to point $C_T$ as the wafer rotates through the sensor assembly 16. The line is a least square fit of the data points obtained in the measurement step described above. Line 61 follows a sine wave shape because the wafer 13 is not exactly centered on the testing turntable, i.e. the center of the wafer $C_W$ does not match the center of rotation $C_T$. The closer $C_W$ is to $C_T$, the flatter the sine wave. At some angles, the edge 48 of the wafer is further from the center of rotation, represented by the peak 62, and at some angles the edge of the wafer is closer to the center of rotation, represented by the valley 64.

Notch 66 in line 61 represents the notch 55 in the edge of the wafer 13, where the distance from the center of rotation to the edge of the wafer drops sharply for a few degrees of rotation.

The computer 32 calculates and generates a graph such as graph 60 from the angle $\theta$, set by the computer, and the radius R, sent to the computer by detector 54 over bus 31. The computer can also display such a graph on a display device such as a monitor or cathode ray tube (CRT).

Figure 7:
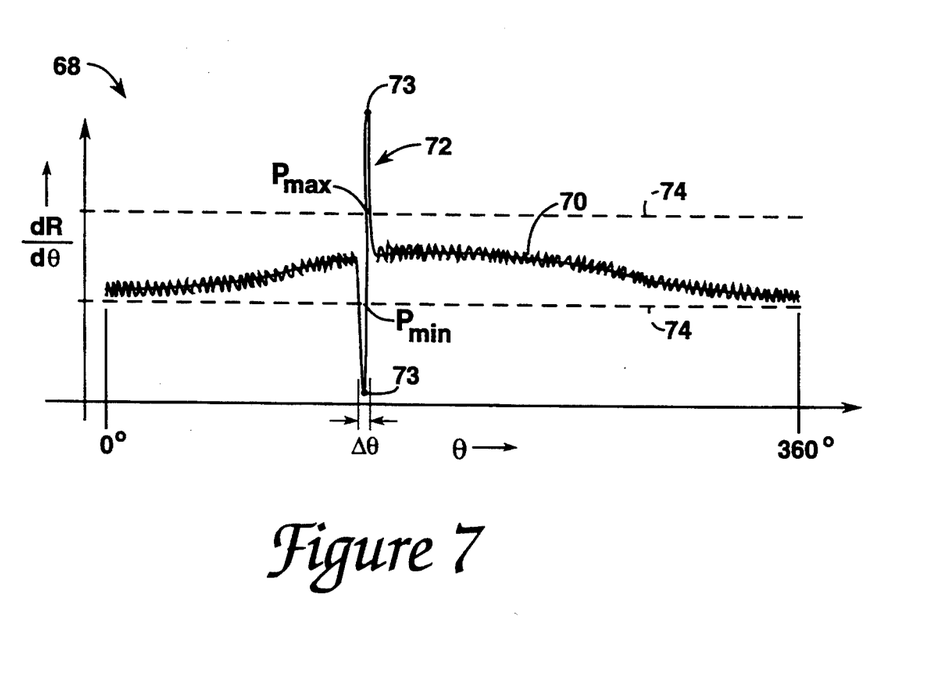
FIG. 7 is a graph of the first derivative of the graph shown in FIG. 6.

FIG. 7 is a graph 68 of the first derivative dR/dO of the derived data. The line 70 is the first derivative of line 61 in FIG. 6. The notch 66 is much more distinct in this graph as the large deviation 72. The line 70 is also more jagged, indicating a certain amount of high-frequency noise that is produced from the derivative (high pass) filtering of the data. Deviation 72 also includes a significant amount of noise so that the position of the maximum and minimum points of the deviation may be difficult to determine.

In order to more accurately determine the notch location, a percentage of the height of the maximum and minimum points of deviation 73 are treated as the new maximum ($P_{max}$) and minimum ($P_{min}$) points. In the preferred embodiment, 20% of the maximum and minimum points of deviation 73 is enough to distinguish the points from the background noise. The dashed lines 74 represent the 20% levels on the graph 68. Up to this point, the computer 32 does not know if the index mark on the wafer is a notch or a flat; these percentage maximum and minimum points are used to determine if the index mark is a notch or flat. The range of angles between $P_{max}$ and $P_{min}$ is $\Delta\theta$. If $\Delta\theta$ is less than 5% of the entire circumference of the wafer, the computer knows that the index mark is a notch, and the notch-finding procedure is initiated. If Δθ is 5%–20% of the circumference of the wafer, the computer initiates the flat-finding procedure (described with reference to FIGS. 9–11).

Figure 8:
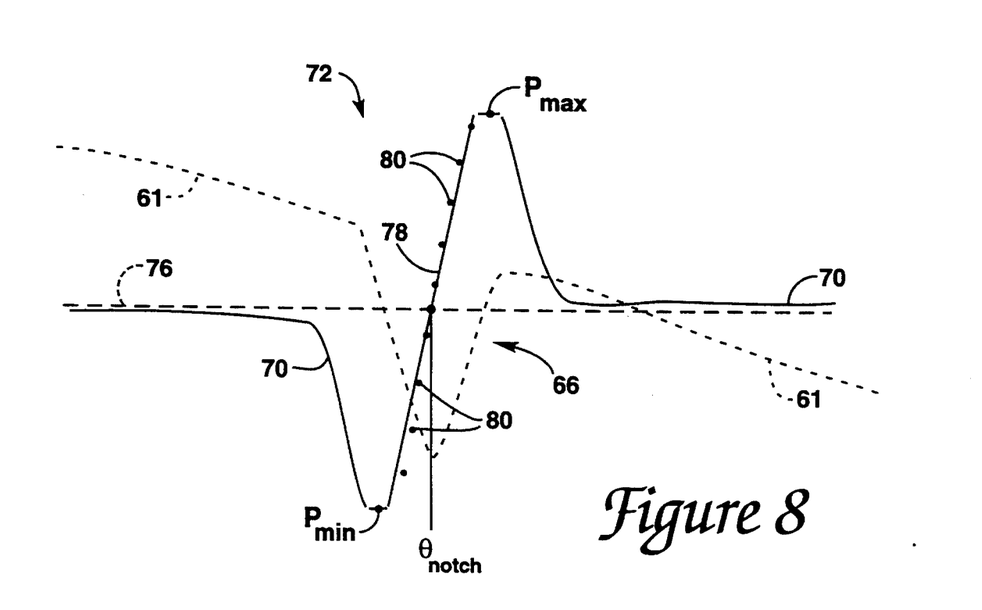
FIG. 8 is a detailed view of the notch representation in the graphs of FIG. 6 and 7.

FIG. 8 is a detailed view of the notch 66 of FIG. 6 and points 80 from the deviation 72 of FIG. 7 between $P_{min}$ and $P_{max}$ used in a notch-finding procedure. A zero line 76 is a straight line constructed from the points outside the deviation 72 on line 70, and represents the circular edge of the wafer.

Next, the line 78 is calculated by taking the least square line fit of the points 80 of deviation 72 between $P_{max}$ and $P_{min}$; the points $P_{max}$ and $P_{min}$ are not used in this calculation, since they are approximations of the actual maximum and minimum. The least square method of fitting a line to datapoints is well known.

The point $\theta_{notch}$ is the point where zero line 76 and fit line 78 intersect, and is an accurate measure of the midpoint of the notch 55. The location of the notch is thus known with reference to the starting rotation point, and the wafer can be rotated to position the notch in a desired direction or the angle of the notch can be simply stored for later use. The robot arm can then pick up the wafer with the notch positioned in this direction.

Figure 9:
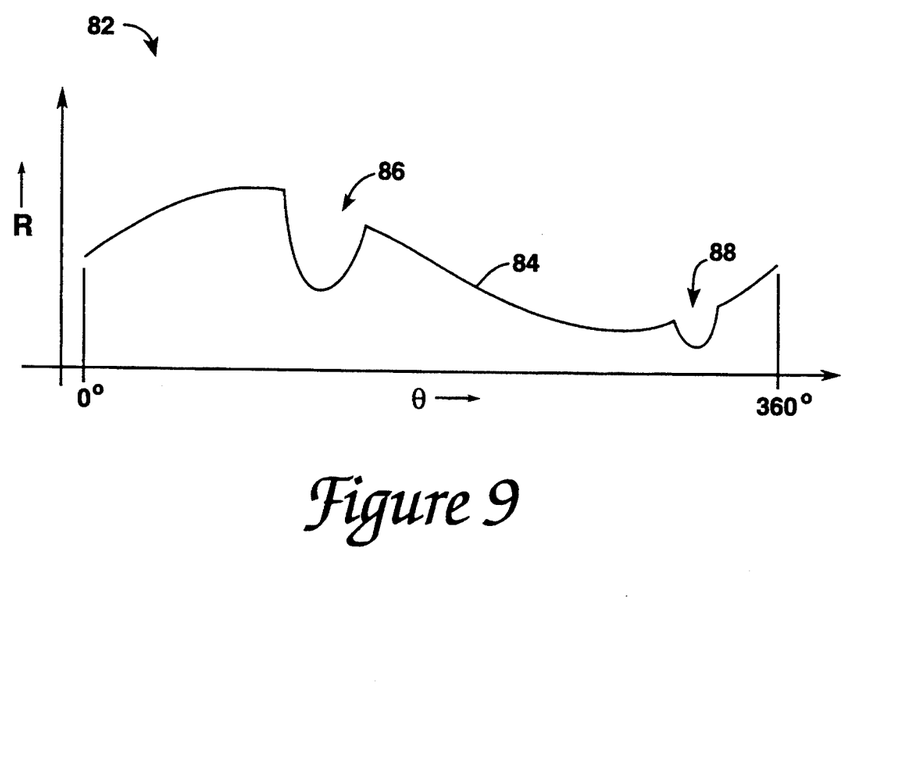
FIG. 9 is a graph of the radius and angle data measured for the wafer of FIG. 5b.

FIG. 9 is a graph 82 of the data measured during the rotation of the wafer shown in FIG. 5b (wafer with flats). The graph 82 is similar to the graph 60 showing data measured from the rotation of a notched wafer. In graph 82, the horizontal axis represents the angle of rotation θ from a reference position, and the vertical axis represents the radius R, as defined previously.

Line 84 represents the distance from the edge of the wafer to point $C_T$ as the wafer rotates through the sensor assembly 16. The line is a least square fit of the data points obtained in the measurement step described above. Line 84 follows a sine wave shape, similar to the line 61 of FIG. 6.

Primary depression 86 in line 84 represents the primary flat 56 in the edge of the wafer 13, where the distance from the center of rotation to the edge of the wafer drops sharply for a few degrees of rotation. Secondary depression 88 in line 84 represents the secondary flat 57 in the edge of the wafer. Depression 88 is, of course, smaller than depression 86 because flat 57 is smaller than flat 56.

Figure 10:
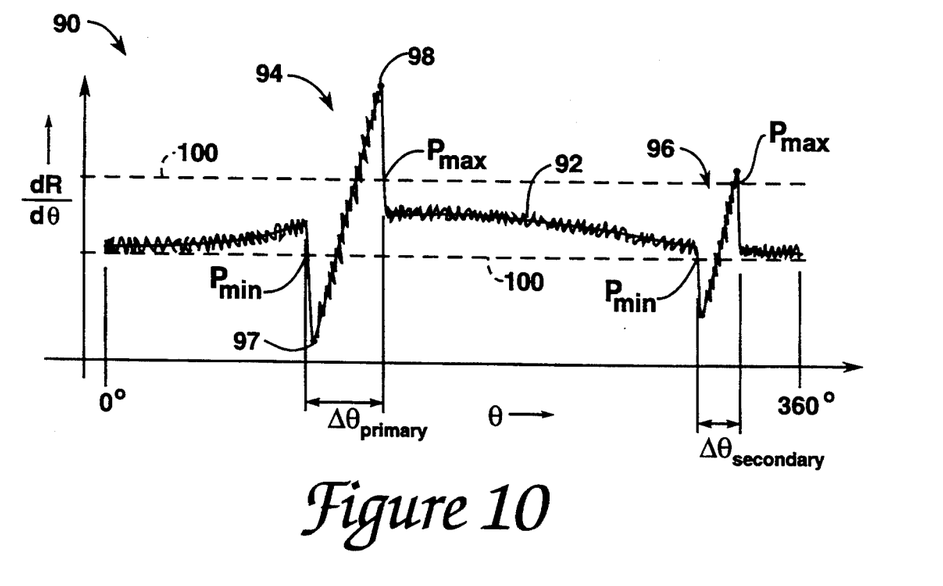
FIG. 10 is: a graph of the first derivative of the graph shown in FIG. 9.

FIG. 10 is a graph 90 of the first derivative dR/dθ of the derived data shown in FIG. 9, similar to graph 68 of the derivative of the data measured from a notched wafer. The line 92 is the first derivative of line 84 shown in FIG. 9. The line 92 is more jagged than line 84, indicating a certain amount of noise. The primary depression 86 is much more distinct in this graph as the primary deviation 94. The secondary depression 88 is shown as secondary deviation 96. In the preferred embodiment, only the orientation of the primary flat 56 is desired. The computer 32 locates the primary deviation 94 by scanning for the highest peak 98 and the lowest valley 97. The secondary deviation 96 is located by scanning for peak and valley levels above the derivative line 92.

Once the flats have been located, a percentage of the maximum and minimum levels are calculated in order to distinguish the points from the noise, similar to the procedure used in the notch-finding process described above. Again, 20% levels are used in the preferred embodiment, shown as dashed lines 100 in FIG. 10. Points $P_{max}$ and $P_{min}$ are points on the deviations at the 20% level, and are calculated for both primary and secondary deviations. The datapoints measured between $P_{max}$ and $P_{min}$ describe the flats, and are shown within the angle ranges Δθprimary and Δθsecondary. The computer can distinguish between the primary and secondary deviations by comparing the sizes of the peaks and valleys, and by also comparing the sizes of Δθ. The datapoints describing the secondary flat 57 must be determined for the center finding procedure (described below).

Once the primary deviation 94 has been detected, the datapoints in the angle range of Δθ$_{primary}$ (i.e., between $P_{max}$ and $P_{min}$ of primary deviation 94) are known to describe the primary flat 56. The (R, θ) datapoints of primary depression 86 within the range Δθ$_{primary}$ (see FIG. 9) are then converted to Cartesian (x-y) coordinates using the well-known equations:

$$X = R \cos \theta \qquad (2)$$

$$Y = R \sin \theta$$

where R is the distance from the flat to the center of the wafer and θ is the angle of rotation. The Cartesian coordinates describe the flat line more concisely than the equivalent polar coordinates because the flat is a straight line, and permit the calculation of the flat orientation to be faster.

Figure 11:
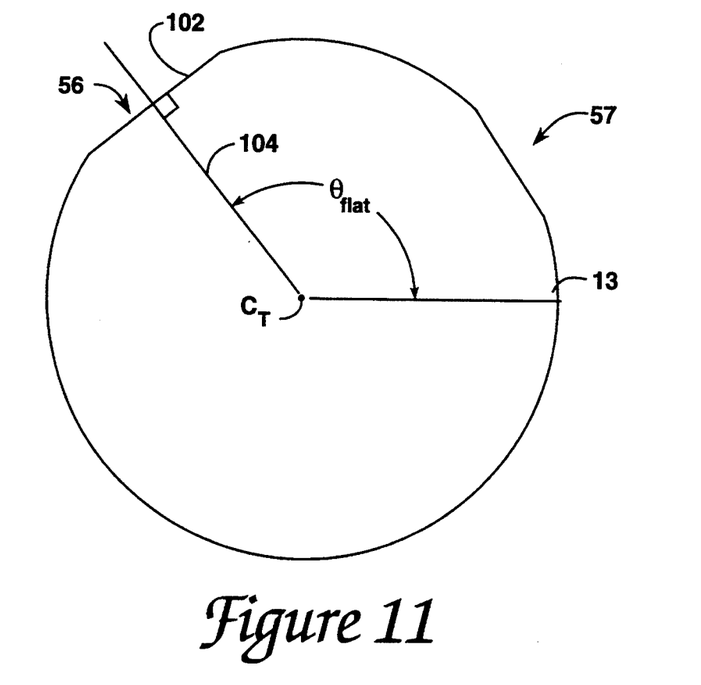
FIG. 11 is a top plan view of a wafer as shown in FIG. 5b and a method used to find the orientation of the primary flat.

FIG. 11 is a top plan view of a wafer with a primary flat 56 and a secondary flat 57 as shown in FIG. 5b. The computer 32 analyzes the Cartesian coordinate datapoints describing the primary flat 56 and makes a least squares line fit 102 to these points. Finally, a line 104 perpendicular to the flat line 102 is calculated and positioned from the center of rotation $C_T$ to the flat. The angle $\theta_{flat}$ of this line from the starting rotation point describes the orientation of the primary flat 56. The primary flat 56 is then rotated on turntable 12 to a desired orientation.

Figure 12:
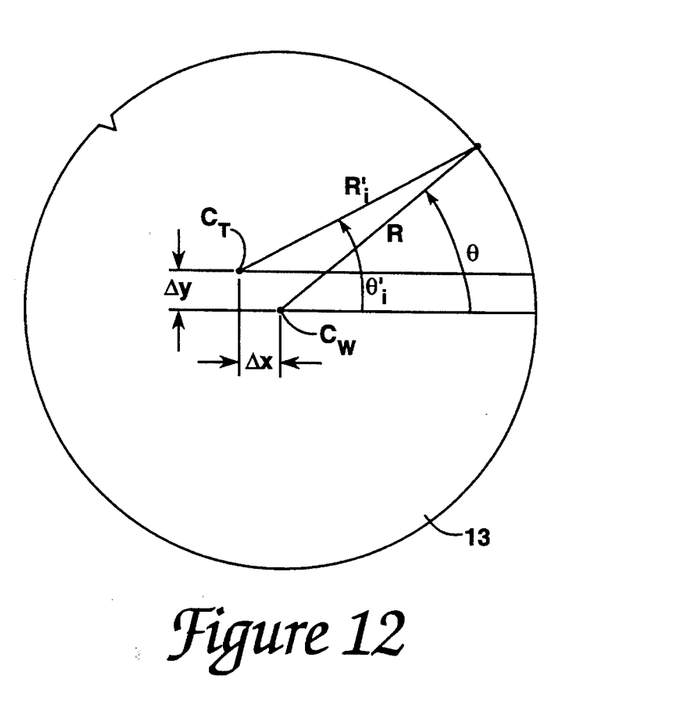
FIG. 12 is a top plan view of a wafer and the distances and angles used in finding the center of the wafer.

FIG. 12 describes the center finding procedure for the present invention. The center of rotation $C_T$ of the wafer is a certain offset distance Δx, Δy from the center of the wafer $C_W$. Several datapoints describing radius $R_i'$ and angle $\theta_i'$ for each datapoint have been measured with respect to $C_T$ in the notch- and flat-finding processes described above, where i is an integer ranging from 1 to N, N being the number of datapoints measured. The center of the wafer $C_W$ has a radius R to the edge of the wafer and an angle θ to a specific point (x',y') on the edge of the wafer. The offset Δx, Δy is calculated to find $C_W$, the center of the wafer.

In the center finding process, the computer 32 first picks all or some of the datapoints ($R_i'$, $\theta_i'$) that do not describe a notch or a flat; these points are known from the notch- and flat-finding processes described above. A point (x', y') on the edge of the wafer can be described as follows:

$$x' = \Delta x + R\cos\theta = R'\cos\theta' \qquad (3)$$

$$y' = \Delta y + R\sin\theta = R'\sin\theta' \qquad (4)$$

By multiplying both sides of equation (3) by cos θ' and both sides of equation (4) by sin θ' and then adding the two equations, the sum can be written as $$R' = \Delta x \cos\theta' + \Delta y \sin\theta' + R(\cos\theta'\cos\theta + \sin\theta'\sin\theta) \qquad (5)$$

which, in making the assumption that $\theta \approx \theta'$, can be simplified to:

$$R' = \Delta x \cos\theta' + \Delta y \sin\theta' + R \qquad (6)$$

A least squares fit of some or all of the datapoints not describing a notch or a flat is then made by the following equation:

$$\chi^2 = \sum_i (R_i' - R'(\theta_i))^2 \qquad (7)$$

A partial derivative of equation (7) is made with respect to R, $\Delta x$, and $\Delta y$ and each partial derivative is set to zero to find the minimum, as is well known for a least squares fit. The three partial derivative equations and equation (6) are then solved simultaneously to find the three unknowns of R, $\Delta x$, and $\Delta y$.

From the above procedure, the computer 32 knows the offset distances $\Delta x$ and $\Delta y$ between the center of rotation and the center of the wafer. The computer can then translate robot arm 17 the offset distance and pick up the wafer at the center $C_W$.

Other methods than the one described above can be used to find the offset distance between the center of rotation $C_T$ and center of wafer $C_W$. From the known datapoints ($R_i'$, $\theta_i'$), the offset distances can be calculated using a variety of mathematical methods.

Figure 13:
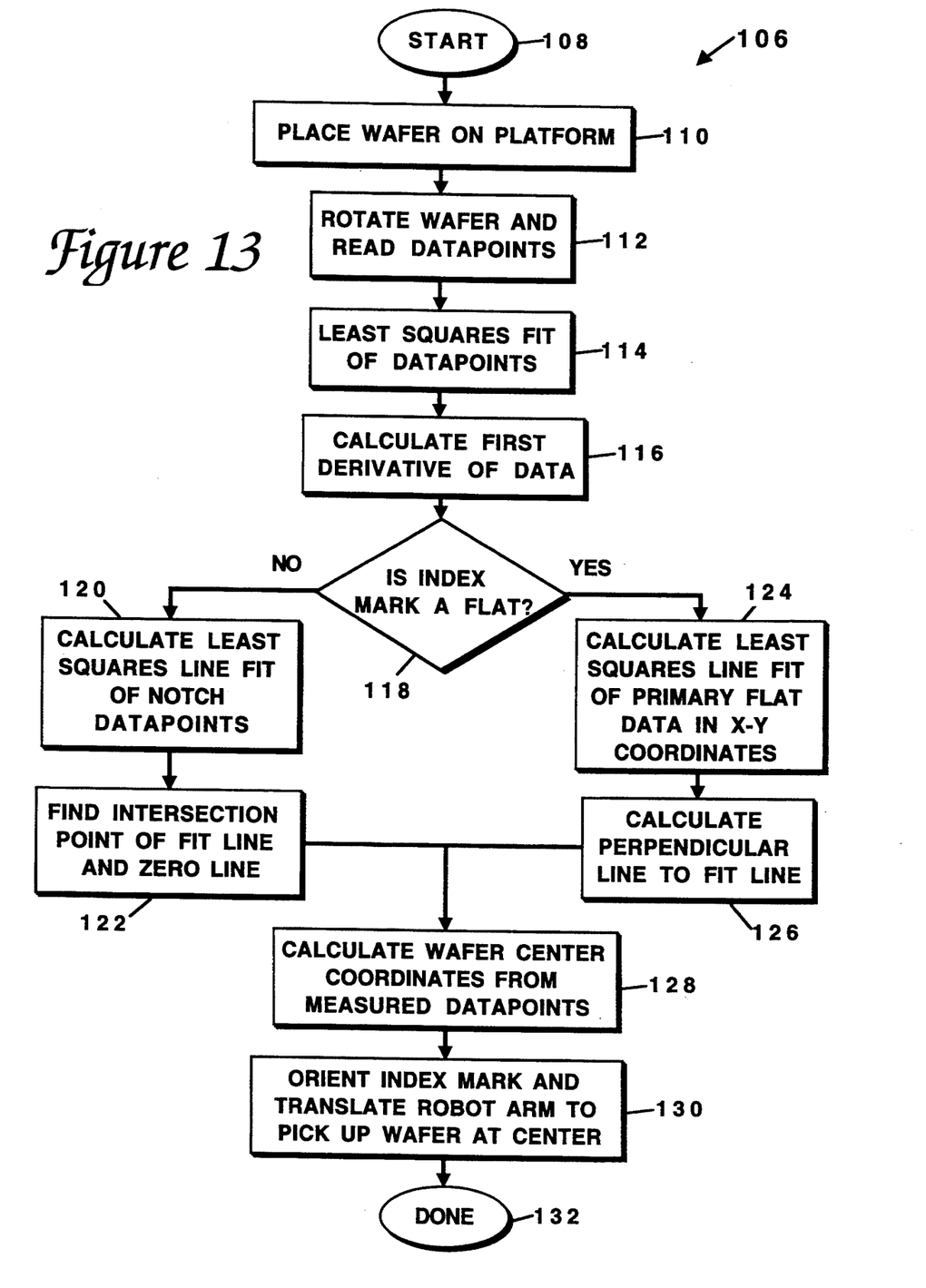
FIG. 13 is a flow diagram of the index mark and center finding method of the present invention.

FIG. 13 is a flow diagram 106 of the index mark and center finding method of the present invention. The process starts with a step 108, and, in a step 110, a wafer is placed on the rotating platform 20 by robot arm 17. In step 112, the platform and wafer are rotated, and angle and radius data of the edge of the wafer is measured by the sensor assembly 16. In step 114, a least squares fit of the data is calculated, and the first derivative of this data is calculated in a step 116. In step 118, the computer determines if the index mark(s) in the edge of the wafer are flats or notches. This is accomplished by examining the range of angles over which a deviation in the derivative occurs, as detailed above. If the range of angles is less than 5% of the circumference of the wafer, the index mark is a notch; if the range of angles is from 5%–20% of the wafer circumference, the index mark is a flat.

If the index mark is a notch, step 120 is initiated, in which the least squares line fit of the notch datapoints between the 20% maximum and minimum points of the deviation is calculated. The angle of the notch is found in step 122, in which the intersection point of the least squares fit line of step 120 and a zero line constructed from points outside the notch deviation is found. The angle of this intersection point is the notch orientation.

If the index mark is determined to be a flat in step 118, step 124 is initiated. The datapoints in the primary deviation are converted to x-y coordinates and used in a least squares line fit. This fit line describes the primary flat of the wafer. In step 126, a line perpendicular to the fit line is constructed which intersects the center of rotation of the wafer. The angle of this perpendicular line is the orientation of the primary flat.

In step 128, the coordinates of the center of the wafer are calculated from the method described with reference to FIG. 12 using the datapoints that do not describe any index marks in the wafer. Finally, in step 130, the found index mark is oriented in a desired direction, the robot arm is translated the offset distance between the center of the wafer and the center of rotation, and the wafer is picked up by the robot arm at the wafer's center to be positioned in a testing or production apparatus.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. A method for finding an index mark on a wafer edge comprising steps of:
   (a) positioning a wafer having an index mark along an edge thereof on a rotatable platform;
   (b) rotating the platform and the wafer to a known angular position;
   (c) measuring a distance at said known angular position between an edge point of said wafer and a reference point to develop a datapoint comprising an angle of said known angular position and said distance;
   (d) repeating steps (b) and (c) to develop a series of datapoints; and
   (e) calculating a derivative of said series of datapoints;
   (f) finding a deviation in said derivative which corresponds to said index mark and performing deviation analysis on datapoints in said deviation to find an angular position of said index mark, wherein said angular position is a center of said index mark, and wherein said step of performing said deviation analysis includes calculating a least square line fit between maximum and minimum points of said deviation of said derivative; and
   (g) orienting and removing said wafer from said rotatable platform without translating said platform.

2. A method as recited in claim 1 wherein said step of positioning a wafer on a rotatable platform is accomplished using robotic means.

3. A method as recited in claim 1 wherein said step (b) is accomplished with a stepper motor.

4. A method as recited in claim 1 wherein said step (c) is accomplished with an electromagnetic sensor.

5. A method as recited in claim 4 wherein said electromagnetic sensor comprises an emitter and detector of electromagnetic radiation disposed on opposing sides of said wafer proximate said edge point.

6. A method as recited in claim 1 wherein said step (f) is accomplished by a computer-implemented process.

7. A method as recited in claim 1 wherein said index mark is a flat provided along said edge of said wafer.

8. A method as recited in claim 1 wherein said index mark is a notch provided along said edge of said wafer.

9. A method as recited in claim 1 wherein said step (f) includes calculating new points which are a predetermined percentage of said maximum and minimum points of said deviation, and treating said new points as maximum and minimum points of said deviation.

10. A method as recited in claim 1 wherein said step (g) includes rotating said wafer so that said wafer is positioned at a desired angular position, and picking up said wafer at said desired angular position.

11. A method as recited in claim 1 wherein said step (g) includes picking up said wafer by referencing and storing said angular position of said index mark.

12. A wafer index mark and center finder comprising:
a turntable operative to support and rotate a wafer around a center of rotation;
a sensor device positioned such that an edge point of said wafer positioned on said turntable can be sensed by said sensor device, said sensor device being operative to measure a distance from said edge of said wafer to a known reference point;
means for storing a plurality of datapoints, each of said plurality of datapoints including said measured distance and an angle of rotation at which said distance was measured, said plurality of datapoints being used to calculate a center of said wafer;
means for calculating a derivative of said plurality of datapoints, where said derivative is used to find a position of an index mark of said wafer by finding a deviation in said derivative and performing deviation analysis on said derivative; and
means for orienting said wafer and removing said wafer from said turntable without translating said turntable.

13. A wafer index mark and center finder as recited in claim 12 wherein said reference point is said center of rotation.

14. A wafer index mark and center finder as recited in claim 13 wherein said sensor device comprises an emitter and detector of electromagnetic radiation disposed on opposing sides proximate said edge point.

15. A wafer index mark and center finder as recited in claim 14 further comprising:
a motor coupled to said turntable for causing said turntable to rotate; and
a controller coupled to said motor and to said sensor device.

16. A wafer index mark and center finder as recited in claim 15 wherein said controller is a digital computer.

17. A wafer index mark and center finder as recited in claim 16 wherein said digital computer is operative to obtain said plurality of datapoints comprising said angle and said distance from said edge of said wafer to a known reference point.

18. A method for finding a center point of a wafer comprising steps of:
measuring a distance between a plurality of edge points of said wafer and a reference point to develop a plurality of datapoints comprising an angle and a distance;
determining a first set of datapoints of said plurality of datapoints which describe all index marks positioned on the edge of said wafer by calculating a derivative of said datapoints; and
calculating said center point of said wafer using a second set of datapoints of said plurality of datapoints which do not describe said index marks.

19. A method as recited in claim 18 wherein said step of measuring a distance is accomplished by providing a relative rotation between said wafer and a sensor device.

20. A method for finding an index mark on a wafer edge comprising steps of:
(a) positioning a wafer having an index mark along an edge thereof on a rotatable platform;
(b) rotating the platform and the wafer to a known angular position;
(c) measuring a distance at said known angular position between an edge point of said wafer and a reference point to develop a datapoint comprising an angle of said known angular position and said distance;
(d) repeating steps (b) and (c) to develop a series of datapoints; and
(e) calculating a derivative of said series of datapoints;
(f) finding a deviation in said derivative which corresponds to said index mark and performing deviation analysis on datapoints in said deviation to find an angular position of said index mark, wherein said step of performing deviation analysis includes determining if said index mark in said wafer is a flat or a notch, wherein said index mark is determined to be a notch when said datapoints in said deviation are under a threshold percentage of said plurality of datapoints; and
(g) orienting and removing said wafer from said rotatable platform without translating said platform.

* * * * *